United States Patent
Kennedy

(10) Patent No.: US 6,208,194 B1
(45) Date of Patent: Mar. 27, 2001

(54) SYNCHRONOUS RECTIFIER MOFSET WITH CONTROLLED CHANNEL VOLTAGE DROP

(75) Inventor: Dennis M. Kennedy, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/224,271

(22) Filed: Dec. 31, 1998

(51) Int. Cl.$^7$ ................................................. H03K 17/687
(52) U.S. Cl. ......................... 327/427; 327/408; 327/530; 327/546
(58) Field of Search .................................. 327/427, 430, 327/431, 432, 433, 434, 435, 436, 437, 403, 404, 407, 408, 544, 545, 546

(56) References Cited

U.S. PATENT DOCUMENTS

| | | | |
|---|---|---|---|
| Re. 36,179 | * 4/1999 | Shimoda | 327/407 |
| 5,475,332 | * 12/1995 | Ishimoto | 327/427 |
| 5,744,878 | * 4/1998 | Wachter et al. | 307/130 |
| 5,886,561 | * 3/1999 | Eitan et al. | 327/408 |
| 5,959,494 | * 9/1999 | Fotouhi | 327/427 |

* cited by examiner

Primary Examiner—Kenneth B. Wells
Assistant Examiner—Paul Dinh

(57) ABSTRACT

A synchronous rectifier MOSFET control circuit which overcomes many of the shortcomings of the prior art employs MOSFET for supplying voltage to a load when the MOSFET is in the forward biased condition (i.e., when an input voltage level exceeds the threshold voltage level by a pre-determined amount). The MOSFET control circuit is configured to turn off the MOSFET when the input voltage level dips below that pre-determined level required to maintain the MOSFET in the forward biased condition. When the MOSFET is turned off, the diode internal to the MOSFET device prevents current flow in the reverse bias direction (i.e., the internal diode prevents current flow from the output to the input), effectively isolating the load from the input voltage source, thereby allowing the capacitors to discharge their energy to the load to maintain a voltage supply to the load which is at or above the output load threshold voltage level. Thus, although a diode is still employed to prevent current flow in the reverse direction, the diode need not function to supply the current to the load when the MOSFET is in the forward biased direction. Rather, current flows through the MOSFET channel (as opposed to flowing through the diode) when the MOSFET is in the forward biased condition.

16 Claims, 5 Drawing Sheets

SYNCHRONOUS RECTIFIER MOFSET WITH CONTROLLED CHANNEL VOLTAGE DROP

BACKGROUND OF THE INVENTION

1. Technical Field

The present invention relates, generally, to a MOSFET control circuit with controlled channel voltage drop and, more particularly, to an improved circuit which provides reverse bias blocking through the use of a diode, but which utilizes a voltage-controlled MOSFET channel in lieu of the blocking diode for forward voltage conduction.

2. Background Art and Technical Problems

Control circuits are often required to deliver a pre-determined threshold voltage to an electrical load, even when the input voltage dips below the threshold voltage required to drive the load. In the case of power supply circuits, for example, it is quite common to augment the power supply with a bank of capacitors configured to discharge their stored energy to the load during the transient periods in which the input voltage source dips below the require threshold voltage, thereby insuring that adequate voltage is supplied to the load at all times. This is particularly important in applications involving health and safety, for example in the avionics industry to maintain power supply to avionics computers, flight control systems, and other on board aircraft electrical loads.

Presently known control circuitry for supplying a threshold voltage to a load notwithstanding transient reductions in the input voltage below the load threshold typically involve the use of a power converter circuit. In particular, a power supply includes a diode through which power is applied to the load, with a bank of capacitors disposed in parallel with the load. Thus, when the input power supply through the diode exceeds the threshold voltage to be applied to the load, the capacitors remain charged and the load "sees" an applied voltage which is at least as great as the threshold level required by the load. When the input voltage (supplied by a battery, generator, or the like) dips below the threshold level, such that the output voltage exceeds the input voltage, the diode blocks current flow in the reverse bias direction, and the capacitors release their energy to the load to maintain the voltage supplied to the load at or above the threshold level until the input source again reaches the load threshold. This technique for maintaining threshold voltage to the load, however, is disadvantageous in several respects.

In particular, the reverse blocking diodes employed in presently known power supplies typically exhibit a voltage drop on the order of 0.5 to 0.8 volts. At high current values, a substantial amount of power is dissipated by the diode, such that the circuit liberates a significant amount of thermal energy. In order to dissipate the heat in a controlled manner, heat sinks and associated hardware are often employed. Moreover, high operating temperatures contribute to diode failure in many applications.

Control circuits are thus needed which effectively isolate the load from the source during transient low voltage conditions at the source, but which reduce power losses and high operating temperatures associated with presently known systems.

BRIEF SUMMARY OF THE INVENTION

The present invention provides a MOSFET control circuit which overcomes many of the shortcomings of the prior art. In accordance with a preferred embodiment of the present invention, a MOSFET control circuit employs a metal oxide semiconductor—field effect transistor (MOSFET) for supplying voltage to a load when the MOSFET is in the forward biased condition (i.e., when an input voltage level exceeds the threshold voltage level by a pre-determined amount). In accordance with a further aspect of the present invention, the MOSFET control circuit is configured to turn off the MOSFET when the input voltage level dips below that pre-determined level required to maintain the MOSFET in the forward biased condition. When the MOSFET is turned off, the diode internal to the MOSFET device prevents current flow in the reverse bias direction (i.e., the internal diode prevents current flow from the output to the input), effectively isolating the load from the input voltage source, thereby allowing the capacitors to discharge their energy to the load to maintain a voltage supply to the load which is at or above the output load threshold voltage level. Thus, although a diode is still employed to prevent current flow in the reverse direction, the diode need not fuction to supply the current to the load when the MOSFET is in the forward biased direction. Rather, current flows through the MOSFET channel (as opposed to flowing through the diode) when the MOSFET is in the forward biased condition.

In accordance with a further aspect of the present invention, conducting current through the MOSFET channel substantially mitigates power losses vis a vis prior art systems inasmuch as the voltage drop across the MOSFET channel can be significantly less than the 0.7 volts typically associated with a diode. This results in more power efficient conversion and reduces the high temperatures associated with prior art schemes in which current flows through the diode to the load. In accordance with a further aspect of the present invention, the use of a MOSFET for conducting current eliminates the need for expensive and cumbersome heat sinks.

BRIEF DESCRIPTION OF THE DRAWING FIGURES

The present invention will hereinafter be described in conjunction with the appended drawing figures, wherein like numerals denote like elements, and:

DETAILED DESCRIPTION OF PREFERRED EXEMPLARY EMBODIMENTS

A MOSFET control circuit in accordance with various aspects of the present invention employs a MOSFET with controlled channel voltage drop for supplying voltage to a load when the input voltage is greater than the output requirement, and which isolates the load from the input when the input voltage is lower than the output threshold. In this regard, the present invention will be described in the context of an avionics application, wherein a pre-determined threshold voltage level is applied to an electrical load, for example an avionics display, a flight control computer, or the like. It will be understood, however, that the avionics power supply example set forth below presents a preferred exemplary embodiment only, and that the subject invention has broad applicability to any number of technologies, applications, and the like wherein it is desirable to block current flow in a reverse biased direction, and further wherein supplying current to a load in a forward biased direction may become problematic if the current is supplied through the blocking diode.

In many aircraft applications, for example in commuter aircraft, DC electrical power is supplied to various electrical systems by a first generator associated with a first jet engine, in conjunction with a second generator associated with a second jet engine. During normal operation, primary power supply may switch from the first generator to the second generator, which occasionally causes transient dips in the voltage level supplied by the generators to the electrical loads. In addition, other factors such as extending and retracting landing gear, significant mechanical reconfiguration of wing flaps, and other events which involve high power consumption, place a short term strain on the power delivery system of the aircraft. This is visible, for example, when reading lights dim during high power consumption events. Although it may be acceptable to have transient dimming of reading lights, certain mission critical systems (e.g., control systems) require a sustained applied voltage above a predetermined threshold level notwithstanding transient fluctuations in the supply voltage.

Figure 1:
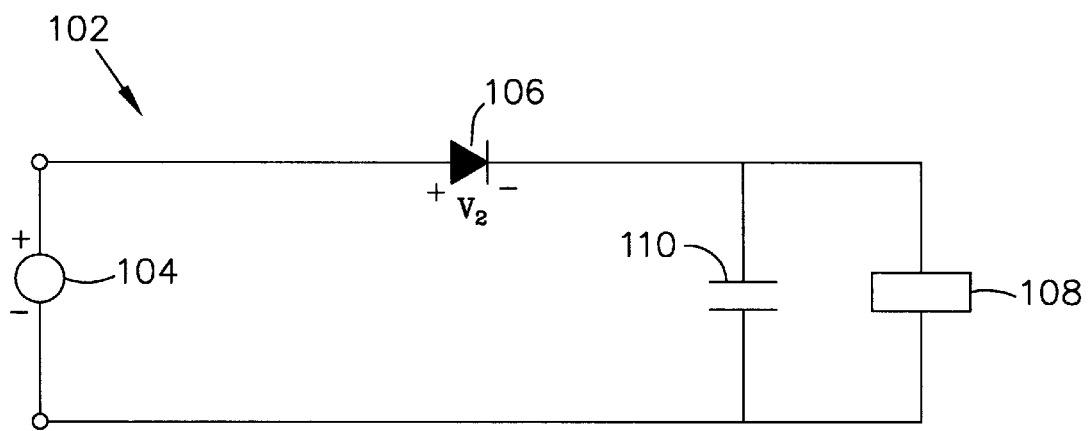
FIG. 1 is a schematic circuit diagram of a prior art control circuit used in conjunction with a power supply, wherein the control circuit includes a forward-biased diode and a capacitor bank in parallel with the load.

Referring now to FIG. 1, an exemplary MOSFET control circuit 102 is configured to supply voltage to an electrical load 108, for example a flight control computer. Circuit 102 suitably comprises a voltage source 104, for example a battery, generator, or the like, a blocking diode 106, and a storage unit 110. During normal operation when the voltage supplied by source 104 exceeds the voltage requirement (also referred to herein as the threshold voltage level) for load 108, storage unit 110 remains fully charged and a blocking diode 106 remains biased in the forward direction, supplying voltage to the load.

On occasion, the supply voltage produced by source 104 may dip below the threshold voltage required by load 108; more particularly, the relevant "threshold" voltage which must be supplied by source 104 during normal operation may be characterized as the voltage level necessary to operate load 108, plus the voltage drop $V_d$ attributable to diode 106. When the input voltage dips below the threshold voltage, capacitor 110 discharges its energy to the load to sustain total voltage supplied to the load above the threshold value notwithstanding the temporary reduction in voltage level produced by source 104. At the same time, blocking diode 106 prevents the energy released from capacitor 110 from flowing toward the source, such that all the energy released by capacitor 110 is applied to the load. When source 104 returns to its normal operating voltage in excess of the load threshold voltage, diode 106 again becomes forward biased, supplying sufficient voltage to the load and recharging capacitor 110.

Although the system shown in FIG. 1 effectively isolates the load from the source during periods in which diode 106 is reversed biased, diode 106 presents a "lossy" situation during normal operation inasmuch as a voltage drop on the order of 0.7 volts occurs across the diode, dissipating significant power in the form of heat. At high current levels, high operating temperatures can result in diode failure.

The present invention provides a MOSFET control circuit which employs a blocking diode to isolate the load from the source during those transient periods in which the source voltage is less than the required threshold voltage, to thereby allow a supplemental voltage source (e.g., a storage cell, a bank of capacitors, or the like) to maintain voltage applied to the load above the threshold value during such transient periods. In accordance with a further aspect of the present invention, during those periods in which the source voltage exceeds the threshold voltage, voltage is supplied to the load through a path other than the blocking diode. This arrangement allows the advantages of the blocking diode during the reverse bias condition, yet avoids the drawbacks associated with using a diode in the forward bias mode of operation. In accordance with an illustrated embodiment, the present invention employs a supply circuit having a field effect transistor for conducting voltage to the load in the forward bias condition, as described in greater detail below.

Figure 2:
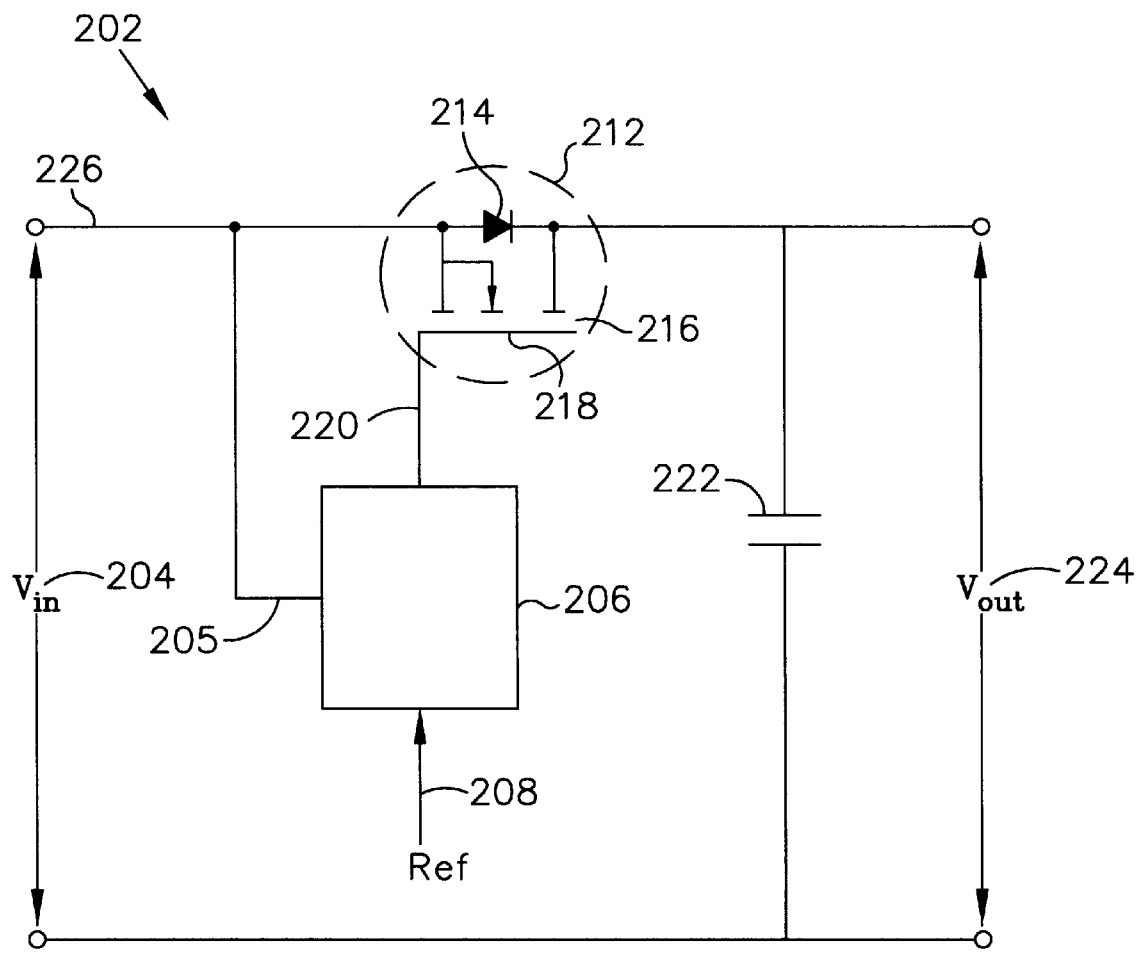
FIG. 2 is a schematic circuit diagram of a MOSFET control circuit in accordance with the present invention, showing a MOSFET and a comparator circuit for controlling the MOSFET.

Referring now to FIG. 2, an exemplary MOSFET control circuit 202 in accordance with the present invention suitably comprises an input voltage source $V_{in}$ 204 configured to supply an operating voltage along input supply line 226 to a load, for example a flight control computer, at an output voltage $V_{out}$ 224. As discussed above, an energy storage unit 222, for example a capacitor network, is suitably disposed in parallel with the load to supply operating voltage to the load during those periods when the input voltage source does not supply the required threshold voltage level for operating the load. The supply of operating voltage (and corresponding current) is suitably controlled by a controllable gate 212 which may comprise any suitable component for supplying voltage to the load when input voltage 204 exceeds a pre-determined threshold voltage for operating the load, as well as to function as a voltage isolator to direct the energy released from voltage storage unit 222 to the load during those transient periods in which the input voltage dips below the required output voltage. In accordance with a preferred embodiment of the present invention, voltage control device 212 suitably comprises a metal oxide semiconductor-field effect transistor (MOSFET) 216. Current flow devices such as, for example, power MOSFET's, are particularly advantageous in the context of the present invention in that they facilitate high current flow while maintaining a relatively low voltage drop as compared to conventional diodes and Shottkey diodes. This contributes to lower power losses and lower operating temperatures as compared to conventional diodes. At the same time, however, the use of a MOSFET 212 as a voltage controlled gating device provides the advantages of blocking current flow in the direction of load to source under conditions in which the MOSFET is reverse biased (i.e., when the load voltage exceeds the source voltage). That is, the invention provides the advantages of a blocking diode in the reverse bias direction, without the problems associated with conducting current in the forward bias direction through a diode and the attendant temperature, failure, and power loss attributes of conventional diodes.

With continued reference to FIG. 2, MOSFET 212 suitably comprises an internal diode 214 and a gate 218 for controlling the current flow through the channel associated with FET 216. In accordance with a particularly preferred embodiment, a reference voltage 208, which suitably exceeds the steady state source voltage 204, is applied to a comparator circuit 206. Comparator circuit 206 suitably includes, inter alia, a voltage divider or other comparator circuit which compares source voltage 204 (via branch 205) to a trigger voltage generated within comparator 206. Thus, if source voltage $V_{in}$ 204 exceeds the trigger voltage, an output signal is applied via conductor 220 to gate 218 to permit current flow through channel 216, thereby supplying the desired output voltage to the load. If, on the other hand, source voltage 204 dips below the trigger voltage generated within comparator 206, comparator 206 turns off gate 218, such that channel 216 of MOSFET 212 is prevented from conducting in either direction. Storage unit 222 then discharges its stored energy to the load, as diode 214 prevents current from flowing from storage unit 222 back to the source. In this way, FET 216 and blocking diode 214 effectively isolate storage unit 222 and the load from the voltage source for so long as the voltage level generated by source 204 is less than the required threshold voltage for the load. Once the source 204 recovers such that $V_{in}$ exceeds $V_{out}$ by an amount at least as great as the voltage drop across FET 216 when forward biased, comparator 206 detects this condition and turns on gate 218 to allow current flow through FET 216, thereby reestablishing the required threshold voltage at the load. At the same time, storage unit 222 again becomes forward biased, recharging the capacitors, battery, or other electronic device comprising the storage unit.

In accordance with the present invention, comparator 206 may comprise any suitable voltage divider network, comparator circuit, operational amplifier, or other configuration of electronic devices which function to compare the input voltage with a desired, trigger voltage level such that control device 212 applies a voltage to the load when the input voltage is equal to or greater than the minimum required load voltage, yet which also isolates the load from the input voltage source for those periods in which the input voltage is less than the minimum required load voltage.

Figure 3A:
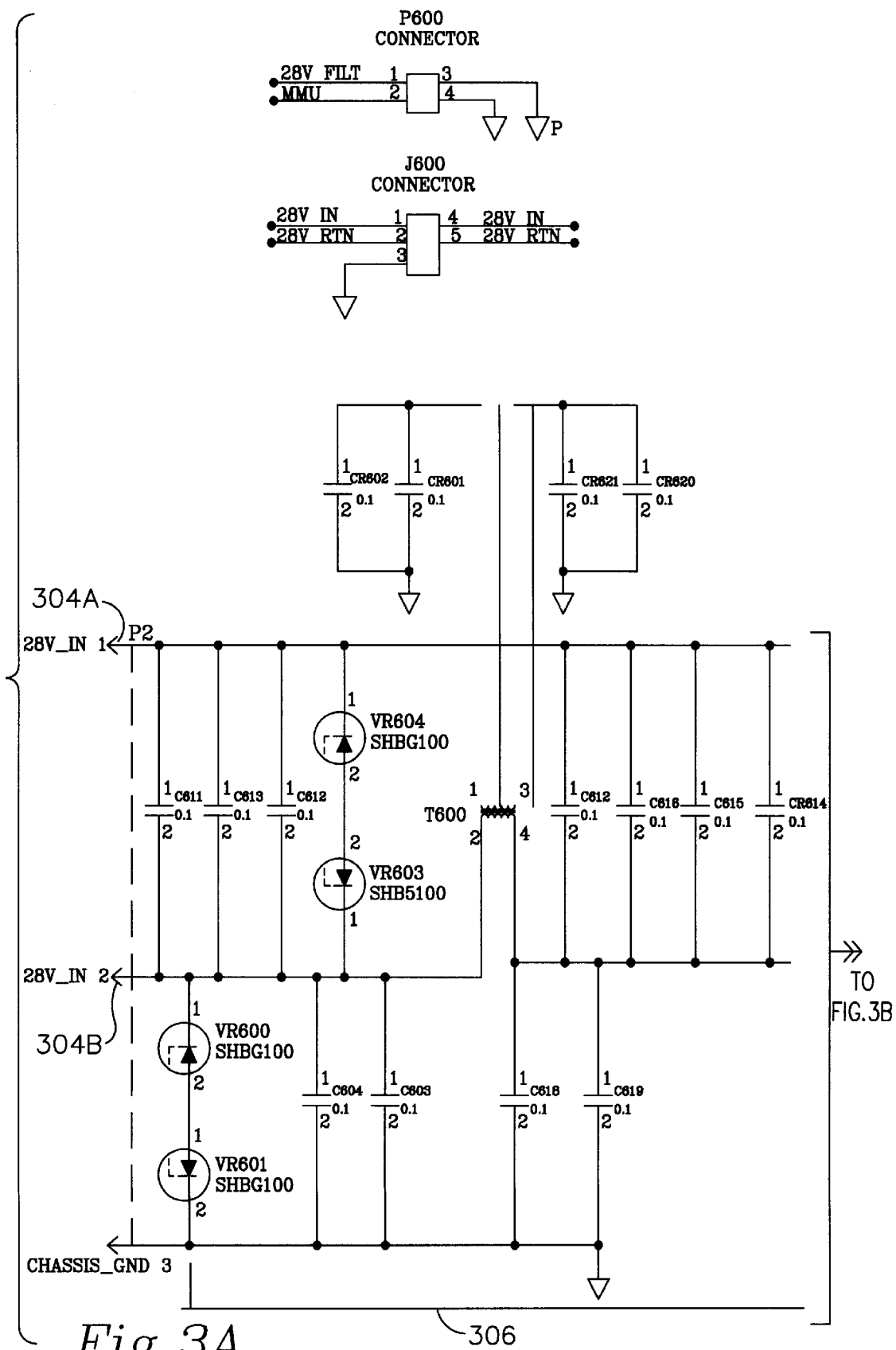
FIG. 3 is a detailed electrical schematic setting forth the various circuit elements employed in a preferred embodiment of the present invention.
Figure 3B:
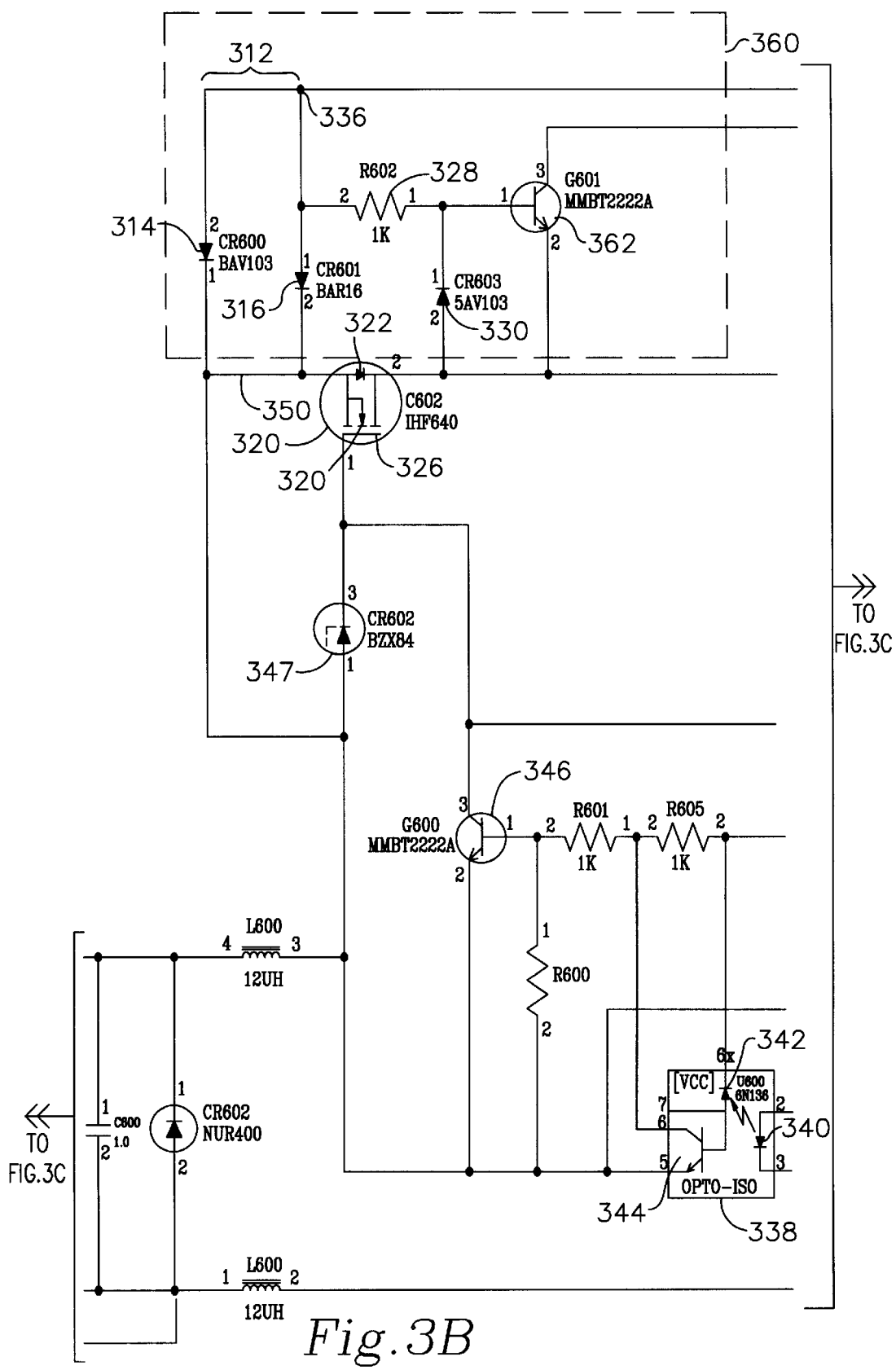
Figure 3C:
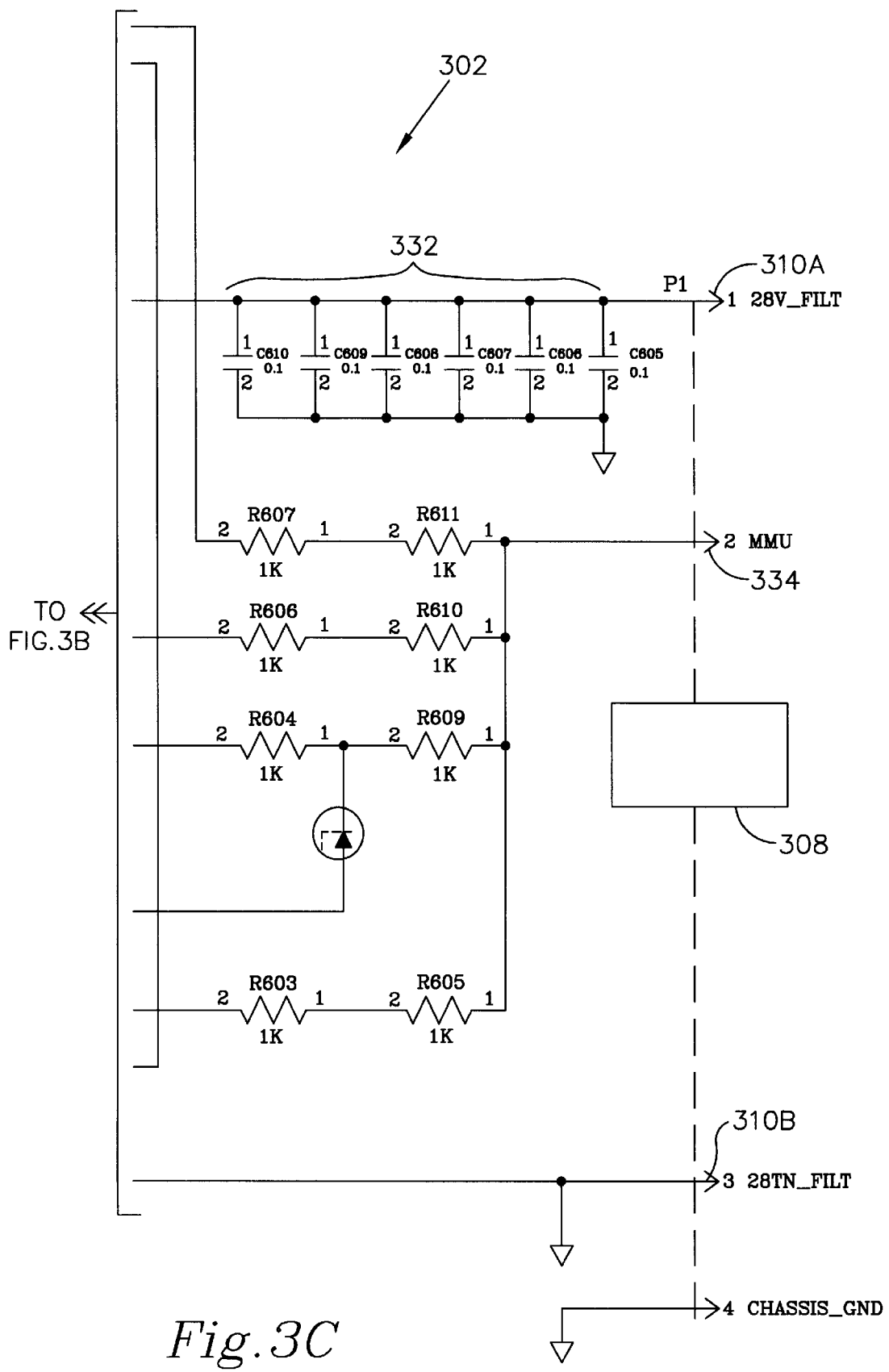

Referring now to FIG. 3, an exemplary MOSFET control circuit 302 in accordance with a particularly preferred embodiment of the present invention will now be described.

MOSFET control circuit 302 suitably comprises respective input terminals 304A and 304B which are connected to a voltage source (not shown) such as a generator, battery, rectifier circuit, or the like. In accordance with the illustrated embodiment, a typical power supply employed in an avionics application may be configured to supply on the order of 28 volts at the input. As discussed in greater detail below, a baseline or threshold output voltage in the range of 28 volts is suitably applied to an electrical output (load) 308, for example a flight control computer or other avionics equipment attached to respective output terminals 310A and 310B.

Those skilled in the art will appreciate that from time to time various voltage surges or voltage spikes may be applied at input terminals 304, for example due to lightning strikes and other transient events. A filter network 306 is therefore advantageously disposed in cooperation with input terminals 304. In the illustrated embodiment, filter 306 suitably comprises a network of capacitors and inductors configured to isolate or otherwise protect the remainder of MOSFET control circuit 302 from high voltage spikes.

With continued reference to FIG. 3, the input voltage is applied at line 350 to a voltage controlled gate 320. In the illustrated embodiment, voltage controlled gate 320 suitably comprises a MOSFET, including a FET channel 324 and an internal blocking diode 322. In accordance with a particularly preferred embodiment, MOSFET 320 suitably comprises an N-channel power MOSFET, for example part number IRF640 manufactured by the Harris Semiconductor Corporation. MOSFET control circuit 302 further comprises a comparator circuit 360 which essentially functions to compare the input voltage level with a pre-determined reference voltage level: if the input voltage is greater than the reference voltage, comparator circuit 360 causes MOSFET 320 to conduct and thereby apply the input voltage to the output terminals. If, on the other hand, comparator circuit 360 determines that the input voltage is less than the reference voltage, comparator 360 causes the FET channel 324 within MOSFET 320 to turn off, whereupon the blocking diode 322 within MOSFET 320 prevents the MOSFET from conducting in the reverse bias direction. When MOSFET 320 is turned off, the energy within capacitor network 322 is applied to the output terminals until the input voltage again rises above the reference voltage, whereupon the MOSFET resumes conducting in the forward biased direction. The manner in which comparator circuit 360 selectively couples and isolates the input from the output as a function of input voltage will now be described in detail.

A mass handling unit (MHU) 334 is suitably configured to supply an operating voltage to comparator circuit 360. To facilitate this discussion, MHU 334 can be viewed as supplying an operating voltage to circuit 360 at node 336. Comparator circuit 360 is suitably configured such that the voltage present at node 336 will conduct current along one of two paths, depending on the magnitude of the input voltage.

More particularly, a first path suitably comprises a selectable reference voltage level defined by either diode 314 or diode 316. The second current conduction path from node 336 suitably comprises resistor 328 and diode 330. In the normal, forward bias state of MOSFET 320, the combined voltage attributable to the input voltage plus reference 312 will be greater than the combined voltage drop associated with resistor 328 and diode 330. Consequently, when the input voltage exceeds the output load threshold voltage level, current flows through resistor 328 and diode 330, which turns on FET 320 as described in greater detail below. When the input voltage level drops below the threshold voltage level required by load 308, circuit 360 is configured such that the combined voltage drop across FET 320 and reference 312 becomes less than the voltage drop associated with resistor 328 and diode 330. As a result, current flows through reference 312, and does not flow through resistor 328 and diode 330, which results in FET 320 being switched off, again as described in greater detail below.

It should be noted, however, that the particular value associated with reference 312 may be preselected in any convenient manner. In the illustrated embodiment, either a first diode 314, for example having a voltage drop on the order of 0.7 volts, or a second diode 316 having a voltage drop on the order of 0.5 volts, may be selected. Although the circuit shown in FIG. 3 shows these two diodes disposed in parallel, it is to be understood that only one of diodes 314 and 316 would actually be utilized in a preferred embodiment. That is, only one of the two diodes would actually be utilized in a working power supply.

More particularly, in some applications it may be desirable to have a relatively low threshold for turning off MOSFET 320, for example where the output load is particularly sensitive to transient currents less than the output load's threshold voltage level. In such a case, it may be desirable to employ diode 316 in circuit 360, with a relatively low reference threshold of 0.5 volts. In other applications, for example where the output load may not be quite as sensitive to small fluctuations in applied voltage, it may be desirable to employ diode 314 which has a slightly higher reference voltage (0.7 volts) associated therewith. It will also be appreciated that circuit 360 may be configured to allow two or even more voltage levels to be selected, either prior to installing the subject power supply in a working environment, or, alternatively, circuit 360 may be configured such that the reference voltage may be selected "on the fly", as desired.

MOSFET control circuit 302 further comprises a capacitor network 332, an opto-isolator 338, a first control transistor 362, and a second control transistor 346. During the normal, forward bias operating mode of MOSFET 320, the input voltage exceeds the load threshold voltage. As such, the voltage supplied by MHU 334 at node 336 travels through resistor 328 and diode 330, since that path provides a lower resistance to current flow than reference path 312 as a result of the relatively high input voltage applied to MOSFET 320 by input terminals 304. With current conducting through resistor 328, voltage is applied to the base of control transistor 362, causing current to flow from the emitter to the collector of transistor 362. Consequently, opto isolator 338 is turned on, causing transistor 346 to turn off, thereby insuring that voltage is applied to gate 326 of MOSFET 320, keeping the MOSFET turned on. The operation of opto isolator 338 and transistor 346 will now be described in greater detail.

Opto-isolator 338 suitably comprises a photo emitter (e.g., an LED) 340, a photo diode 342, and a transistor 344. When current flows through resistor 328, voltage is applied to the base of first control transistor 362. Current thus flows from the emitter to the collector of transistor 362, applying a voltage to LED 340. Photo diode 342 detects the light emitted by photo emitter 340, and turns on thereby causing transistor 334 to conduct. Current flowing from the collector to the emitter through transistor 344, second control transistor 346 is kept in the off position (i.e., voltage is not supplied to the base of transistor 346). With transistor 346 off, the input voltage from terminals 304 is applied to gate 326 of MOSFET 320, keeping the FET channel open allowing MOSFET 320 to conduct in the forward biased direction and supplying input voltage to the load for so long as the input voltage remains above the load threshold voltage.

When the input voltage dips down below the load threshold voltage, MOSFET 320 is turned off in the following manner.

When the input voltage dips below the output load threshold voltage level, the combined voltage drop associated with reference path 312 and MOSFET 320 becomes less than the combined voltage drop associated with resistor 328 and diode 330. Consequently, current supplied by MHU 334 at node 336 flows through selector 312, and current does not flow through resistor 328 and diode 330. With no current flowing through resistor 328, no current or voltage is applied to the base of transistor 362 and, as a result, transistor 362 turns off.

With transistor 362 in the off condition, LED 340 turns off, which turns off photo diode 342. Turning photo diode 342 off causes transistor 344 to stop conducting, allowing voltage to be applied from MHU 334 to the base of transistor 346, thereby turning transistor 346 on. With transistor 346 on, gate 326 of MOSFET 320 is turned off, such that no current is conducted through the FET channel 324 associated with the MOSFET. Turning MOSFET 320 off in this manner effectively isolates the load from the input, with blocking diode 322 preventing current from flowing from the load side of the circuit to the input side of the circuit. With MOSFET 320 off, capacitors 322 discharge their energy to the load until the input voltage level again rises above the threshold output voltage level, whereupon MOSFET 320 is again forward biased to supply at least the output threshold voltage level to the output terminals.

The present invention has been described herein in conjunction with the drawing figures.

It will be appreciated, however, that the drawing figures are intended to be illustrative and are not intended to be limiting. Indeed, various modifications in the particular design and selection of elements set forth in the drawings may be made without departing from the spirit and scope of the present invention as set forth in the appended claims.

What is claimed is:

1. A MOSFET control circuit for selectively controlling a channel voltage in the forward direction of the channel, comprising:
    a MOSFET comprising an internal reverse bias blocking diode and a forward conducting FET channel, said MOSFET having an input voltage associated therewith;
    a comparator circuit configured to compare the magnitude of said input voltage to a reference voltage level; and
    a control transistor configured to supply voltage to the gate associated with said MOSFET channel when said comparator circuit determines that said input voltage exceeds said reference voltage, and further wherein said control transistor is configured to turn off voltage to said gate of said MOSFET when said comparator determines that said input voltage level is less than said reference voltage level;
    wherein said MOSFET control circuit includes a power source circuit for a load, wherein said power source circuit comprises an energy storage unit in parallel with said input voltage.

2. The MOSFET control circuit of claim 1 wherein said internal reverse biased diode is configured to prevent current flow in a reverse direction when said comparator determines that said input voltage level is less than said reference voltage level.

3. The MOSFET control circuit of claim 1 wherein said energy storage unit is configured to provide a backup voltage to said load when said comparator determines that said input voltage level is less than said reference voltage level.

4. The MOSFET control circuit of claim 2 wherein said internal reverse biased diode is configured such that said diode does not substantially consume power when said comparator determines that said input voltage level is greater than said reference voltage level.

5. A control circuit for supplying a voltage to a load, said control circuit comprising:
    a voltage source configured to provide an operating voltage to said load;
    an energy storage unit connected in parallel with said voltage source and with said load;
    a controllable gate electrically situated between said voltage source and said energy storage unit, wherein said controllable gate is operational to provide said operating voltage to said load when said operating voltage exceeds a threshold voltage, and wherein said controllable gate is further operational to provide an output from said energy storage unit to said load and to electrically isolate said voltage source from said load when said operating voltage is less than said threshold voltage.

6. The control circuit of claim 5 wherein said controllable gate comprises a MOSFET comprising an internal reverse bias blocking diode and a forward conducting FET channel.

7. The control circuit of claim 6 wherein said internal reverse biased diode is configured to prevent current flow in a reverse direction when said operating voltage is less than said threshold voltage.

8. The control circuit of claim 7 wherein said internal reverse biased diode is configured such that said diode does not substantially consume power when said operating voltage is greater than said threshold voltage.

9. The control circuit of claim 6 further comprising a comparator coupled to said controllable gate, wherein said comparator receives said operating voltage and said threshold voltage and wherein said comparator is configured to provide a comparator output signal as a function of the difference between said operating voltage and said threshold voltage.

10. The control circuit of claim 9 wherein said internal reverse biased diode is configured to prevent current flow in a reverse direction when said operating voltage is less than said threshold voltage.

11. The control circuit of claim 10 wherein said internal reverse biased diode is configured such that said diode does not substantially consume power when said operating voltage is greater than said threshold voltage.

12. A method of controlling a voltage supplied to a load, the method comprising the steps of:

providing a voltage source configured to provide an input voltage;

monitoring said input voltage with respect to a threshold voltage at a comparator;

providing a signal from said comparator to a gate of a MOSFET, wherein said signal is configured to activate said MOSFET when said input voltage exceeds said threshold voltage such that said input voltage is provided to said load, and further wherein said signal is further configured to deactivate said MOSFET when said input voltage is less than said threshold voltage; and providing an energy storage unit in parallel with said voltage source and said load such that said energy storage unit is activated when said input voltage is less than said threshold voltage.

13. The method of claim 12 further comprising the step of electrically isolating said voltage source from said energy storage unit when said input voltage is less than said threshold voltage.

14. The method of claim 13 wherein said MOSFET comprises an internal reverse bias blocking diode and a forward conducting FET channel.

15. The method of clam 14 wherein said blocking diode is operational to electrically isolate said voltage source from said energy storage unit when said input voltage is less than said threshold voltage.

16. The method of claim 15 wherein current in said MOSFET flows through said FET channel when said input voltage is greater than said threshold voltage such that said blocking diode consumes substantially no power when said input voltage is greater than said threshold voltage.

\* \* \* \* \*